United States Patent [19]

Abe et al.

[11] Patent Number: 5,334,486
[45] Date of Patent: Aug. 2, 1994

[54] PHOTOPOLYMERIZABLE COMPOSITION AND DRY PS PLATE

[75] Inventors: Yukio Abe; Tatsuji Higashi; Tsumoru Hirano; Syunichi Kondo, all of Shizuoka, Japan

[73] Assignee: Fuji Photo Film Co., Ltd., Minami-Ashigara, Japan

[21] Appl. No.: 811,671

[22] Filed: Dec. 23, 1991

[30] Foreign Application Priority Data

Dec. 27, 1990 [JP] Japan .................................. 2-407843
Jul. 18, 1991 [JP] Japan .................................. 3-178456

[51] Int. Cl.$^5$ ............................................. G03F 7/027
[52] U.S. Cl. ................................... 430/288; 430/272; 430/281; 430/303; 522/117; 522/173
[58] Field of Search ............... 430/303, 280, 272, 281, 430/285, 288, 286, 283; 522/100, 103, 173, 117

[56] References Cited

U.S. PATENT DOCUMENTS

| | | | |
|---|---|---|---|
| 3,894,873 | 7/1975 | Kobayashi et al. | 430/303 |
| 4,086,093 | 4/1978 | Ezumi et al. | 430/281 |
| 5,061,598 | 10/1991 | Abe et al. | 430/300 |

FOREIGN PATENT DOCUMENTS

| | | |
|---|---|---|
| 0088623 | 9/1983 | European Pat. Off. |
| 4109523 | 9/1991 | Fed. Rep. of Germany |

OTHER PUBLICATIONS

*Chemical Abstracts,* Chemistry of Synthethic High Polymers, Jun. 1, 1987, vol. 106, No. 22, p. 681, No. 186528p (JP 61,175,636).
*Chemical Abstracts,* Chemistry of Synthetic High Polymers, Mar. 25, 1985, vol. 102, No. 12, p. 513, No. 103633n (JP 59,154,443).

*Primary Examiner*—Janis L. Dote
*Attorney, Agent, or Firm*—Burns, Doane, Swecker & Mathis

[57] ABSTRACT

A photopolymerizable composition comprising: (a) a compound obtained by reacting one mole of a polyamine represented by the following general formula (I) with at least 2 moles of a compound having a group capable of reacting with the polyamine and a polymerizable ethylenically unsaturated group:

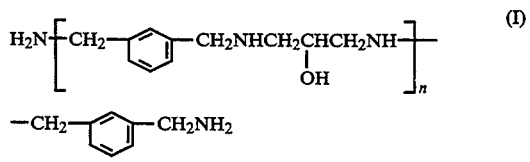

wherein n is an integer of not less than 1 and (b) a photopolymerization initiator.

A dry PS plate comprises a substrate provided thereon with, in order, a light-sensitive resin layer and a silicone rubber layer wherein the light-sensitive resin layer comprises the photopolymerizable composition and a polymeric compound having film-forming ability.

The photopolymerizable composition and the dry PS plate have very high sensitivity.

3 Claims, No Drawings

PHOTOPOLYMERIZABLE COMPOSITION AND DRY PS PLATE

BACKGROUND OF THE INVENTION

The present invention relates to a novel photopolymerizable composition highly sensitive to actinic light rays, which is suitably used as a material for preparing a resin letterpress plate, a lithographic printing plate, a resist material such as a dry film resist or a resist for gravure printing, a photomask and a proof material.

The present invention also relates to a presensitized plate suitable for use in making a lithographic printing plate which allows printing without using any dampening water.

Photopolymerizable compositions have widely been used in various applications, in an industrial scale, for performing printing, copying and forming resists.

The composition in general comprises an ethylenically unsaturated compound or another type of polymerizable compound and a photopolymerization initiator or system and optionally comprises, for instance, a polymeric compound having film-forming ability, a heat polymerization inhibitor or a plasticizer. In addition, there has been well known a method for forming an image which comprises forming a solution of such a photopolymerizable composition, applying the solution to a substrate to form a light-sensitive material provided with a layer of the photopolymerizable composition (light-sensitive layer), imagewise exposing the light-sensitive layer through a desired original to polymerize and harden the photopolymerizable composition on the exposed area, and dissolving and removing the unexposed area by treating it with an organic solvent or an alkaline water capable of dissolving only the unexposed area to form an image composed of the hardened portion. In such a method, there have been used, for instance, benzyl, benzoin, anthraquinone, Michler's ketone and thioxanthone as photopolymerization initiators; and, for instance, oligoester (or polyester) unsaturated carboxylates obtained by ester condensation of esters of unsaturated carboxylic acids and aliphatic polyols, or oligoesters (or polyesters) of polyvalent carboxylic acids and aliphatic polyols with unsaturated carboxylic acids as ethylenically unsaturated compounds.

However, these photopolymerizable compositions have low sensitivity and thus it takes a long time to harden the compositions through imagewise exposure and hence they have low workability.

On the other hand, there have been proposed various kinds of presensitized plates (hereinafter referred to as "dry PS plates") for use in making a lithographic printing plate which allows printing without using any dampening water (hereinafter referred to as "dry lithographic printing plate"). Among these, dry PS plates which comprise a substrate provided thereon with, in order, a light-sensitive resin layer and a silicone rubber layer have particularly excellent properties and examples thereof include those disclosed in Japanese Patent Publication for Opposition Purpose (hereinafter referred to as "J. P. KOKOKU") Nos. Sho 54-26923 and Sho 55-22781.

The silicone rubber layer used in the dry PS plate is usually a polymer comprising, as a main skeleton, a polysiloxane chain, which is partially crosslinked with a crosslinking agent. As methods for hardening the silicone rubber layer, there have usually been known the following two methods:

(1) Condensed Type: a method in which an organopolysiloxane having hydroxyl groups on both ends is crosslinked with a silane or siloxane having a hydrolyzable functional group directly bonded to the silicon atom to give a silicone rubber; and (2) Addition Type: a method in which a polysiloxane having $\equiv$Si—H groups is subjected to an addition reaction with a polysiloxane having -CH=CH- groups to give a silicone rubber (see, for instance, Japanese Unexamined Patent Publication (hereinafter referred to as "J. P. KOKAI") NO. Sho 61-73156 and Japanese Patent Appln. Serial No. (hereinafter referred to as "J. P. A. No.") Hei 1-301568 (=J. P. KOKAI No. Hei 3-161753)).

The hardening properties of the condensed type silicone rubber layer and the adhesion thereof to a light-sensitive layer are influenced by the moisture content of the atmosphere during hardening. Therefore, if it is used in a dry PS plate, the sensitivity of the resulting dry PS plate is liable to cause scattering and thus it is difficult to produce dry PS plates having stable sensitivity. For this reason, the addition type silicone rubber is considered to be superior to the condensed type one since the former does not have such a drawback.

As the light-sensitive resin layer for positive-working PS plates, there have been used photopolymerizable light-sensitive compositions which are hardened through exposure to light. A method for forming images on a PS plate having such a layer structure generally comprises exposing the light-sensitive layer to light to harden the same or optionally photoadhering the light-sensitive layer to the uppermost silicone rubber layer at the interface therebetween to thus give non-image area comprising the silicone rubber layer. In this respect, these layers are firmly linked together and the penetration of a developer into the light-sensitive layer and the corresponding dissolution thereof are prevented. On the other hand, image areas are formed by permeating a developer into the unhardened light-sensitive resin layer through the silicone rubber layer to partially or completely dissolve the unhardened light-sensitive resin layer and then removing the silicone rubber layer on the unhardened light-sensitive layer through the application of a physical force. Images are thus formed on a dry PS plate. However, the dry PS plate has sensitivity lower than that of the usual PS plate for use in making a lithographic printing plate which requires the use of dampening water during printing and, therefore, a long imagewise exposure time is required during plate-making, which in turn leads to low workability.

SUMMARY OF THE INVENTION

Accordingly, an object of the present invention is to provide a photopolymerizable composition highly sensitive to actinic light rays.

Another object of the present invention is to provide a highly sensitive dry PS plate.

The inventors of this invention have investigated a variety of photopolymerizable compositions. As a result, they have found out that (1) the following specific photopolymerizable compounds show high hardening rates and that (2) a highly sensitive dry PS plate comprising a substrate provided thereon with, in order, a light-sensitive resin layer and a silicone rubber layer can be obtained by incorporating the specific photopolymerizable compound into the light-sensitive resin layer and have completed the present invention based on this finding.

According to one aspect of the present invention, there is provided a photopolymerizable composition comprising:

(a) at least one compound obtained by reacting one mole of a polyamine represented by the following general formula (I) with at least 2 moles of a compound having a group capable of reacting with the polyamine and a polymerizable ethylenically unsaturated group:

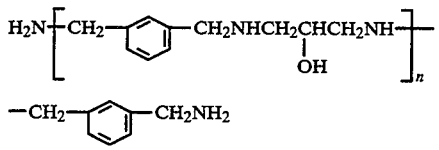

wherein n is an integer of not less than 1, and (b) a photopolymerization initiator.

According to another aspect of the present invention, there is provided a dry PS plate which comprises a substrate, a light-sensitive resin layer applied onto the substrate and a silicone rubber layer applied onto the light-sensitive layer, wherein the light-sensitive resin layer comprises at least the following components:

(a) at least one compound obtained by reacting one mole of a polyamine represented by the formula (I) with at least 2 moles of a compound having a group capable of reacting with the polyamine and a polymerizable ethylenically unsaturated group, (b) a photopolymerization initiator, and (c) a polymeric compound capable of forming a film.

DETAILED DESCRIPTION OF THE INVENTION

The present invention will hereinafter be described in more detail.

Photopolymerizable Compositions

The photopolymerizable composition of the invention comprises the following components (a) and (b) and optional additives such as (c) a polymeric compound having film-forming ability, (d) an ethylenically unsaturated group-containing monomer or oligomer other than Component (a), (e) a heat polymerization inhibitor, (f) a coloring agent, (g) a plasticizer and (h) a surface-smoothening agent.

(a) At least one compound obtained by reacting one mole of a polyamine represented by the foregoing general formula (I) with at least 2 moles of a compound having a group capable of reacting with the polyamine and a polymerizable ethylenically unsaturated group:

In the polyamine (I) used in the invention, n is an integer of not less than 1, preferably 1 to 50 and more preferably 1 to 20 from a synthesis standpoint.

Examples of the compound having a group capable of reacting with the polyamine and a polymerizable ethylenically unsaturated group include those represented by the following general formulae (II), (III) and (IV):

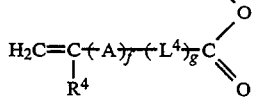 (II)

 (III)

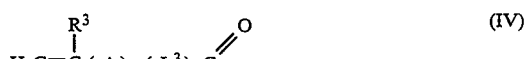 (IV)

wherein $R^1$, $R^2$, $R^3$ and $R^4$ each represents a hydrogen atom or a methyl group;

A represents —CO—O—, —CO—NH— or a substituted or unsubstituted phenylene group;

$R^5$ represents COX or $SO_2X$ wherein X represents a halogen atom;

a, b, c, d, e, f and g each represents 0 or 1;

$L^1$, $L^2$, $L^3$ and $L^4$ each represents a bivalent connecting group, preferably —$(L^5)_p$—$(L^6)_q$—;

$L^5$ represents a substituted or unsubstituted, cyclic or linear alkylene group having 1 to 20 carbon atoms, a substituted or unsubstituted phenylene group having 6~40 carbon atoms or a substituted or unsubstituted aralkylene group having 7~40 carbon atoms, wherein examples of the substituents are alkyl groups having 1 to 6 carbon atoms, halogen atoms, hydroxyl group and aryl groups;

$L^6$ represents —(O—($E^1$))—, —(S—($E^2$))—, —(N-H—($E^3$))—, —(CO—O—($E^4$))— or —($SO_2$N-H—($E^5$))— wherein $E^1$, $E^2$, $E^3$, $E^4$ and $E^5$ each represents an alkylene, phenylene or aralkylene group defined above; and p is an integer of not less than 1 and q is 0 or an integer of not less than 1.

More preferably, when p is 1 and q is 0, $L^1$ is an alkylene group having 1 to 6 carbon atoms; and p is 1 and q is an integer of not less than 1, $L^1$ is an alkylene group having 1 to 6 carbon atoms and $L^2$ is —(O—($E^1$))— or —(NH—($E^3$))— wherein $E^1$ and $E^3$ each represents an alkylene group having 1 to 6 carbon atoms.

Specific examples of the compounds having a group capable of reacting with the polyamine and a polymerizable ethylenically unsaturated group include glycidyl (meth)acrylate, (meth) acrylic acid chloride and (meth)acrylic anhydride.

The compound having a group capable of reacting with the polyamine and a polymerizable ethylenically unsaturated group is added in an amount ranging from 2 moles to the molar number required for completely reacting with the total active hydrogen of the polyamine (I) per mole of the polyamine. The compound is preferably added in an amount ranging from 2 moles to (4+3n) moles, more preferably 4 moles to (4+2n) moles per mole of the polyamine wherein n is the same as in general formula (1). These compounds having a group capable of reacting with the polyamine and a polymerizable ethylenically unsaturated group may be used in combination.

The amount of these compounds of Component (a) ranges from 1 to 99% by weight, more preferably 5 to 60% by weight on the basis of the total weight of the light-sensitive composition.

Specific examples of the compounds of Component (a) are listed in Table 1, but the present invention is not restricted to these specific compounds.

TABLE 1

| Compound[*1)] | n of Formula (I)[*2)] | Polymerizable Ethylenically Unsaturated Group-Containing Compound | |
|---|---|---|---|
| | | Structural Formula | Added Molar No[*3)] |
| A | 1 | $CH_2=C(CH_3)-COOG$[*4)] | 6 |
| B | 2 | " | 8 |
| C | 3 | " | 10 |
| D | 2 | $CH_2=C(CH_3)-COCl$ | 8 |
| E | 2 | $CH_2=CH-COCl$ | 8 |

[*1)]Reaction product of the polyamine (I) with a polymerizable ethylenically unsaturated group-containing compound.
[*2)]

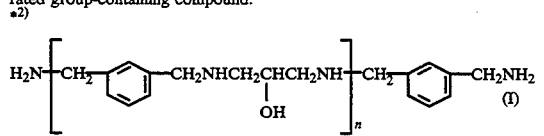

(I)

[*3)]The molar number of the polymerizable ethylenically unsaturated group-containing compound added per mole of the polyamine (I).
[*4)]G represents a glycidyl group.

(b) Photopolymerization Initiator

As the photopolymerization initiators, i.e., Component (b) used in the invention, various kinds of known photopolymerization initiators can be used as long as they can absorb actinic rays and effectively initiate the polymerization of Component (a). Examples thereof are as follows:

(i) benzophenone derivatives such as benzophenone, Michler'ketone, xanthone, anthrone, thioxanthone, acridone, 2-chloroacridone and 2-chloro-N-n-butylacridone;

(ii) benzoin derivatives such as benzoin, benzoin methyl ether and benzoin ethyl ether;

(iii) quinones such as p-benzoquinone, β-naphthoquinone and β-methylanthraquinone;

(iv) sulfur-containing compounds such as dibenzyldisulfide and di-n-butyldisulfide;

(v) azo or diazo compounds such as 2-azo-bis-isobutyronitrile, 1-azo-bis-1-cyclohexanecarbonitrile, p-diazobenzylethylaniline and Congo Red;

(vi) halogen atom-containing compounds such as carbon tetrabromide, silver bromide, α-chloromethylnaphthalene and trihalomethyl-s-triazine compounds; and (vii) peroxides such as benzoyl peroxide.

More specific examples of photopolymerization initiators used in dry PS plates of the present invention include vicihal polyketaldonyl compounds as disclosed in U.S. Pat. No. 2,367,660; α-carbonyl compounds as disclosed in U.S. Pat. Nos. 2,367,661 and 2,367,670; acyloin ether compounds as disclosed in U.S. Pat. No. 2,448,828; aromatic acyloin compounds which are substituted at the α-position as disclosed in U.S. Pat. No. 2,722,512; polynuclear quinone compounds as disclosed in U.S. Pat. Nos. 3,046,127 and 2,951,758; combinations of triarylimidazole dimers/p-aminophenyl ketone as disclosed in U.S. Pat. No. 3,549,367; benzothiazole type compounds as disclosed in U.S. Pat. No. 3,870,524; benzothiazole type compounds/trihalomethyl-s-triazine compounds as disclosed in U.S. Pat. No. 4,239,850; acridine and phenazine compounds as disclosed in U.S. Pat. No. 3,751,259; oxadiazole compounds as disclosed in U.S. Pat. No. 4,212,970; trihalomethyl-s-triazine compounds having chromophoric groups as disclosed in U.S. Pat. Nos. 3,954,475 and 4,189,323 and J. P. KOKAI Nos. Sho 53-133428, Sho 60-105667, Sho 62-58241 and Sho 63-153542; and benzophenone group-containing peroxy ester compounds as disclosed in J. P. KOKAI Nos. Sho 59-197401 and Sho 60-76503. These compounds may be used alone or in combination.

The amount of these photopolymerization initiators to be added ranges from 0.1 to 20% by weight and more preferably 1 to 10% by weight on the basis of the total weight of the light-sensitive composition.

(c) Polymeric Compound Having Film-Forming Ability

As the polymeric compounds having film-forming ability used in the invention as Component (c), a wide variety of polymeric compounds may be used as long as they are organic polymeric compounds having compatibility with Components (a) and (b). Examples thereof include methacrylic acid copolymers, acrylic acid copolymers, crotonic acid copolymers, maleic acid copolymers, partially esterified maleic acid copolymers, acidic cellulose derivatives, polyvinyl pyrrolidone, polyethylene oxide, alcohol-soluble polyamides, polyesters, unsaturated polyesters, polyurethanes, polystyrene, epoxy resins, phenoxy resins, polyvinyl butyrals, polyvinyl formals, polyvinyl chlorides, polyvinyl alcohols, polyvinyl alcohols partially modified with acetal, water-soluble polyamides, water-soluble urethanes, gelatins and water-soluble cellulose derivatives.

Moreover, polymeric compounds having, on the side chains, photopolymerizable or photocrosslinkable olefinically unsaturated double bonds can be used as the film-forming polymeric compounds. Examples of such polymeric compounds are copolymers of allyl (meth)acrylate/(meth)acrylic acid/optional other addition-polymerizable vinyl monomers and alkali metal and amine salts thereof as disclosed in J. P. KOKAI No. Sho 59-53836; hydroxyethyl (meth)acrylate/(meth)acrylic acid/alkyl (meth)acrylate copolymers and alkali metal and amine salts thereof which are reacted with (meth)acrylic acid chloride as disclosed in J. P. KOKOKU No. Sho 59-45979; addition products of maleic anhydride copolymers with pentaerythritol triacrylate through half-esterification and alkali metal and amine salts thereof as disclosed in J. P. KOKAI No. Sho 59-71048; addition products of styrene/maleic anhydride copolymers with monohydroxyalkyl (meth)acrylate, polyethylene glycol mono(meth) acrylate or polypropylene glycol mono(meth)acrylate through half-esterification and alkali metal and amine salts thereof; (meth)acrylic acid copolymers or crotonic acid copolymers in which the carboxyl groups are partially reacted with glycidyl (meth)acrylate and alkali metal and amine salts thereof; reaction products of hydroxyalkyl (meth)acrylate copolymers, polyvinyl formals or polyvinyl butyrals with maleic anhydride or iraconic anhydride and alkali metal and amine salts thereof; reaction products of hydroxyalkyl (meth)acrylate/(meth)acrylic acid copolymers with 1:1 adduct of 2,4-tolylene diisocyanate/hydroxyalkyl (meth)acrylate and alkali metal and amine salts thereof; (meth)acrylic acid copolymers partially reacted with allyl glycidyl ether and alkali metal and amine salts thereof as disclosed in J. P. KOKAI No. Sho 59-53836; vinyl (meth)acrylate/(meth)acrylic acid copolymers and alkali metal and amine salts thereof; allyl (meth)acrylate/sodium styrenesulfonate copolymers; vinyl (meth)acrylate/sodium styrenesulfonate copolymers; allyl (meth)acrulate/acrylamide/sodium 1,1-dimethylethylenesulfonate copolymers, vinyl (meth)acrylate/acrylamide/sodium 1,1-dimethylethylenesulfonate copolymers, 2-allyloxyethyl methacrylate/methacrylic acid copolymers and 2-allyloxyethyl methacrylate/2-methacryloxyethyl hydrogen succinate copolymers. These polymers may be used alone or in combination.

These polymeric compounds are incorporated into the light-sensitive composition in an amount of 30 to 99% by weight and preferably 50 to 97% by weight on the basis of the total weight of the composition.

(d) Ethylenically Unsaturated Group-Containing Monomer or Oligomer Other Than Component (a)

The ethylenically unsaturated group-containing monomers or oligomers other than Component (a) optionally used in the invention are, for instance, monomers or oligomers having at least one polymerizable (meth)acrylate or allyl group. Specific examples thereof are as follows:

(A) acrylates or methacrylates of alcohols (such as ethanol, propanol, hexanol, octanol, cyclohexanol, glycerin, trimethylolpropane and pentaerythritol);

(B) reaction products of amines (for instance, methylamine, ethylamine, butylamine, benzylamine, ethylenediamine, hexylenediamine, diethylenetriamine, hexamethylenediamine, xylylenediamine, dimethylamine, diethylamine, ethanolamine, diethanolamine and aniline) with glycidyl acrylate, allyl glycidyl or glycidyl methacrylate;

(C) reaction products of carboxylic acids (for instance, acetic acid, propionic acid, benzoic acid, acrylic acid, methacrylic acid, succinic acid, maleic acid, phthalic acid, tartaric acid and citric acid) with glycidyl acrylate, glycidyl methacrylate, allyl glycidyl or tetraglycidyl m-xylylenediamine;

(D) amide derivatives (for instance, acrylamide, methacrylamide, N-methylol acrylamide and methylenebisacrylamide); and (E) reaction products of epoxy compounds with acrylic acid or methacrylic acid.

Specific examples thereof are urethane acrylates as disclosed in J. P. KOKOKU Nos. Sho 48-41708 and Sho 50-6034 and J. P. KOKAI No. Sho 51-37193; polyfunctional acrylates and methacrylates such as polyester acrylates and epoxy acrylates obtained by reacting epoxy resins with (meth)acrylic acid as disclosed in J. P. KOKAI No. Sho 48-64183 and J. P. KOKOKU Nos. Sho 49-43191 and Sho 52-30490; and N-methylol acrylamide derivatives as disclosed in U.S. Pat. No. 4,540,649. Further, it is also possible to use those disclosed in Journal of The Adhesive Society of Japan, 1984, 20, No. 7, pp. 300–308 as photohardenable monomers and oligomers.

The unsaturated groups of the foregoing polyfunctional monomers may be any combination of acryl, methacryl and allyl groups. They can be used alone or in combination.

The monomers or oligomers as Component (d) are incorporated into the light-sensitive composition in an amount of 1 to 70% by weight, preferably 3 to 60% by weight on the basis of the total weight of the composition. Moreover, the ratio (weight ratio) of Component (a) to Component (d) ranges from 100:0 to 20:80, preferably 80:20 to 40:60.

(e) Heat Polymerization Inhibitor

The photopolymerizable composition of the present invention preferably comprises, in addition to the foregoing components, a heat polymerization inhibitor and useful examples thereof are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

(f) Coloring Agent

As the coloring agents, there may be mentioned, for instance, pigments such as titanium oxide, carbon black, iron oxide, phthalocyanine pigments and azo pigments; and dyes such as Methylene Blue, Crystal violet, Rhodamine B, Fuchsine, Auramine, azo dyes and anthraquinone dyes. These coloring agents are preferably selected so that they do not absorb light rays of wavelengths absorbed by the photopolymerization initiator. The coloring agent is added to the composition in an amount ranging from 0.1 to 30 parts by weight for pigments and from 0.01 to 10 parts by weight, preferably 0.1 to 3 parts by weight of dyes per 100 parts by weight of the total weight of Components (a), (c) and (d).

When the composition comprises the foregoing coloring agent, dichloromethyl stearate and other chlorinated fatty acids are preferably used as auxiliary agents for coloring agents and the amount thereof to be incorporated ranges from 0.005 to 0.5 part by weight per one part by weight of the coloring agent used. However, when a plasticizer is used in the photopolymerizable composition, the use thereof is not necessary.

(g) Plasticizer

Examples of plasticizers are phthalic acid esters such as dimethyl phthalate, diethylphthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate and diallyl phthalate; glycol esters such as dimethylglycol phthalate, ethylphthalyl ethyl glycolate, methylphthalyl ethyl glycolate, butylphthalyl butyl glycolate and triethylene glycol dicaprylate; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; triethyl citrate, glycerin triacetyl ester and butyl laurate.

(h) Surface Smoothening Agent

Examples of surface smoothening agents are lanolin, paraffin waxes and natural waxes.

(i) Other Additives

The photopolymerizable composition of the present invention may optionally comprise dyes or pigments for coloring the light-sensitive resin layer and/or pH indicators or leuco dyes as print out agents.

If the photopolymerizable composition is used as a light-sensitive layer of the dry PS plate, it may further comprise a small amount of silicone compounds such as polydimethylsiloxane, methylstyrene-modified polydimethylsiloxane, olefin-modified polydimethylsiloxane, polyether-modified polydimethylsiloxane, silane coupling agents, silicone diacrylate and silicone dimethacrylate depending on purposes. Silicon atom-containing surfactants or fluorine atom-containing surfactants may be added to the composition for improving the coating properties thereof. Further, diazo resins may be incorporated into the composition for improving the adhesion between the resulting light-sensitive resin layer and the primer layer. The amount of these additives is in general not more than 10% by weight on the basis of the total weight of the light-sensitive composition. It is also possible to optionally add silica powder or hydrophobic silica powder whose surface is treated with a silane coupling agent having (meth)acryloyl or allyl groups in an amount of not more than 50% by weight on the basis of the total weight of the composition.

The foregoing various additives optionally added to the composition of the invention can be used in an amount of up to 3% by weight, preferably up to 1% by weight on the basis of the total weight of the photopolymerizable composition.

Photopolymerizable Light-sensitive Material Obtained by Using the Composition of the Present Invention It is most general to use the photopolymerizable composition of the invention as a photopolymerizable light-sensitive material which can be formed by dissolving it in a solvent to form a coating solution thereof, applying the resulting solution onto a substrate having a proper shape in any known manner and then removing the solvent.

Examples of solvents include ketones such as acetone, methyl ethyl ketone, methyl isobutyl ketone, cyclohexanone and diisobutyl ketone; alcohols such as methanol, ethanol and 2-methoxyethanol; esters such as 2-methoxyethyl acetate, propylene glycol methyl ethyl acetate, methyl lactate, ethyl lactate, ethyl acetate, butyl acetate, n-amyl acetate, methyl formate, ethyl propionate, dimethyl phthalate and ethyl benzoate; aromatic hydrocarbons such as toluene, xylene, benzene and ethylbenzene; halogenated hydrocarbons such as carbon tetrachloride, trichloroethylene, chloroform, 1,1,1-trichloroethane, monochlorobenzene and chloronaphthalene; ethers such as propylene glycol monomethyl ether, tetrahydrofuran, diethyl ether, ethylene glycol monomethyl ether and ethylene glycol monoethyl ether acetate; dimethylformamide, dimethylsulfoxide, water or mixture thereof.

The coated amount of the composition suitably ranges from about 0.1 to 20 g/m$^2$, preferably 0.5 to 10 g/m$^2$ (weighed after drying).

Substrates to which the composition of the invention is applied may be those having planar, cylindrical or other various shapes. Examples of planar substrate are glass, silicon oxide, ceramics, paper, metals such as aluminum, zinc, magnesium, copper, iron, chromium, nickel, silver, gold, platinum, palladium, aluminum-based alloys, zinc-based alloys, magnesium-based alloys, copper-zinc alloys, iron-nickel-chromium alloys and copper-based alloys, metal compounds such as aluminum oxide, tin oxide ($SnO_2$) and indium oxide ($In_2O_3$), polymers such as regenerated cellulose, cellulose nitrate, cellulose diacetate, cellulose triacetate, cellulose acetate butyrate, cellulose acetate propionate, polystyrene, polystyrene terephthalate, polyethylene isophthalate, polycarbonate of bisphenol A, polyethylene, polypropylene, nylon, polyvinyl chloride, vinyl chloride/vinyl acetate copolymers, vinyl chloride/vinylidene chloride copolymers, polyacrylonitrile, poly(methyl acrylate) and poly(methyl methacrylate). Further, it is also possible to use laminated substrates comprising two thin plates of the foregoing substances firmly bonded together such as cermet, iron-aluminum laminate plates and iron-chromium-copper laminate plates, paper whose surface is coated with polyethylene, paper whose surface is coated with cellulose triacetate, aluminum plates which is anodized to form an aluminum oxide layer on the surface, chromium plates on which a chromium oxide layer is formed in a known manner, glass plates on which a tin oxide layer is formed and silicon oxide plates on which an indium oxide layer is formed.

These substrate may be transparent or opaque depending on the applications of the light-sensitive image-forming material. Moreover, the transparent substrates may be colorless or colored by the addition of a dye or pigment as disclosed in J. SMPTE, 1958,67, p. 296. On the other hand, the opaque substrates may be those opaque by nature such as paper and metals as well as those obtained by adding a pigment such as titanium oxide to transparent substances, plastic films whose surface is treated by the method disclosed in J. P. KOKOKU No. Sho 47-19068 and paper and plastic films to which carbon black or the like is added to make them completely lightproof.

Moreover, it is likewise possible to use substrates on which fine pits are formed by, for instance, graining, electrolytic etching, anodization and chemical etching; and those subjected to a surface-pretreatment such as corona discharge, UV irradiation and a flame treatment. In addition, plastic substrates whose strength is improved by incorporation of a reinforcing material such as glass fibers and metal whiskers can be used.

The substrate may optionally be subjected to a silicate treatment or an underlying coating can be applied on the surface thereof as a layer for improving adhesiveness, for preventing halation or for absorbing UV rays or visible light rays.

In the light-sensitive material in which the composition of the invention is used, imagewise exposure thereof is performed using a vacuum printing frame as disclosed in U.S. Pat. No. 3,060,026, a transparent peelable cover is applied thereon or a coating layer having low oxygen permeability is applied onto the light-sensitive material as disclosed in J. P. KOKOKU No. Sho 40-17828 in order to prevent the reduction of photopolymerization rate (sensitivity) thereof due to oxygen.

Exposure To Light and Hardening

Actinic light rays for polymerizing the photopolymerizable composition of the invention may be those from any light sources as long as they can provide an effective exposure value and specific examples of the light sources are carbon arc lamps, mercury vapor lamps, xenon lamps, fluorescent lightings, argon glow discharge tubes, Flood lamps for photography, van de Graaff acceleration, various lasers such as argon laser. The irradiation of light can be performed by any one of known methods or combinations thereof.

The light-irradiation may be performed at any desired temperature, but most suitably ranges from about 10°C. to about 40°C., i.e., around room temperature from the practical standpoint. Moreover, the light-sensitive material can be heated after the light-irradiation for increasing the degree of hardening and the heating is usually carried out at a temperature ranging from 40° to 120°C.

Factors which determine the rate of photopolymerization, hardening and drying of the photopolymerizable composition of the invention are, for instance, surface properties of the substrate used, specific components in the composition, the content of the photopolymerization initiator present in the composition, the thickness of the layer of the composition, properties of a light source used (properties of the irradiated spectra), the presence or absence of oxygen and the ambient temperature.

The hardened composition of the invention is already in the dried state and elastic, has wear resistance and resistance to chemicals and exhibits excellent ink receptivity, blotproofing properties, printing properties or the like. Thus, it is particularly suitable for use as a printing plate material for letterprint and lithographic printing to which light-sensitive properties are imparted in advance as well as photoresists.

Other Applications of the Composition of the Invention

Of course, the composition of the present invention is likewise used in, for instance, light-sensitive printing inks, photohardenable adhesives for adhesing metal foils, films, paper, woven fabrics or the like, photohardenable paints for metals, plastics, paper, wood, metal foils, woven fabrics, glass, board, boxboard or the like and various photohardenable marks such as road marks or signposting, channel marks and marks for parking zones.

For instance, when the composition is used as vehicles for printing inks, it can be colored with a proper amount of a dye and simultaneously pigmented with various kinds of known organic pigments such as Molybdate Orange, titanium white, chrome yellow, Phthalocyanine Blue and carbon black. Moreover, the acceptable amount of the vehicle ranges from about 20 to 99.9% based on the metal content of the composition and the amount (weight) of the coloring agent ranges from 0.1 to 80%. Examples of printing materials are paper, paper coated with clay and boxboard.

The composition is further adapted for treating woven fabrics of natural and synthetic fibers. For instance, it can be used in vehicles for cloth-printing inks or those used in special treatments of woven fabrics for imparting waterproofness, oil-resistance, resistance to staining, and crease resistance thereto.

The photopolymerizable composition of the invention can be used as a paint for printing or coating the surface of metals, glass and plastics in a roller-coating or spray-coating system. Further, the composition may be used as a paint for coating, using a color coating system, glass, polyester films and vinyl polymer films; cellophane coated with polymers, treated and untreated polyethylene, treated and untreated polypropylene or the like such as those used for making disposable cups or bottles. Examples of metals to be coated with such a paint are tinplates with or without a sizing treatment.

Dry PS Plate

The present invention will now be explained with respect to the dry PS plate. The dry PS plate of the present invention should have flexibility sufficient for putting it on the usual printing press and must withstand the load applied thereto during printing. Therefore, typical substrate therefor are, for instance, coated paper, metal plates such as aluminum plates, plastic films such as a polyethylene terephthalate film, rubber sheets or composite materials thereof. A coating layer such as a primer layer may be applied onto these substrates for preventing halation or for other purposes.

Various kinds of primer layers are used for improving the adhesion between a substrate and a light-sensitive resin layer, for preventing halation, for coloring images and for improving printing properties. Examples thereof include those obtained by exposing various kinds of light-sensitive polymers to light to harden the same prior to the application of a light-sensitive resin layer as disclosed in J. P. KOKAI No. Sho 60-22903; those obtained by thermally hardening epoxy resins as disclosed in J. P. KOKAI No. Sho 62-50760; hardened gelatin films as disclosed in J. P. KOKAI No. Sho 63-133151; and those comprising urethane resins as disclosed in J. P. KOKAI NO. Hei 3-200965 and J. P. A. No. Hei 2-21072. Besides, hardened case in films are also effective as primer layers. Further, the foregoing primer layers may comprise a polymer having a glass transition point of not more than room temperature such as polyurethane, polyamide, styrene/butadiene rubber, carboxy-modified styrene/butadiene rubber, acrylonitrile/butadiene rubber, carboxy-modified acrylonitrile/butadiene rubber, polyisoprene, acrylate rubber, polyethylene, chlorinated polyethylene and chlorinated polypropylene for softening the primer layers. The amount of these polymers to be incorporated into the primer layer is not critical as long as a film can be formed and thus the primer layer may optionally be formed from such an additive polymer alone. Moreover, these primer layer may comprise other additives such as dyes, pH indicators, printing out agents, photopolymerization initiator, auxiliary agents for adhesion (for instance, polymerizable monomers, diazo resins, silane coupling agents, titanate coupling agents and aluminum coupling agents), white pigments and/or silica powder depending on the foregoing purposes. The coated amount of the primer layer in general ranges from 0.1 to 20 g/m² and preferably 1 to 10 g/m² (weighed after drying).

The light-sensitive resin layer of the dry PS plate of the present invention comprises the photopolymerizable composition described above. The coated amount of the composition suitably ranges from about 0.1 to 20 g/m², preferably 0.5 to 10 g/m² (weighed after drying).

Silicone Rubber Layer

The silicone rubber layer preferably used in the present invention is that obtained from a linear or partially crosslinked polydiorganosiloxane which has the following repeating units:

wherein R represents an alkyl group, an aryl group, an alkenyl group or a monovalent group obtained by combining these groups, which may have functional groups such as halogen atoms and amino, hydroxyl, alkoxy, aryloxy, (meth)acryloxy and thiol groups. The silicone rubber may optionally comprise inorganic powder such as silica, calcium carbonate and titanium oxide powder; the foregoing auxiliary agents for adhesion such as silane coupling agents, titanate type coupling agents or aluminum type coupling agents and/or photopolymerization initiators.

As materials for the foregoing polymer (silicone rubber) comprising polysiloxane as a main skeleton, there can be used polysiloxanes having functional groups at the ends and a molecular weight ranging from several thousands to several hundreds of thousands. They are hardened by crosslinking the same in the following manner to give a silicone rubber layer. More specifically, a silane type crosslinking agent having the following general formula is added to the foregoing polysiloxane having hydroxyl group(s) at either of or both ends, followed by optional addition of an organometal compound such as an organotin compound, an inorganic acid and/or a catalyst such as an amine and heating of the polysiloxane and the silane type crosslinking agent or hardening at ordinary temperature through condensation:

$$R_n SiX_{4-n}$$

wherein n is an integer of 1 to 3, R has the same meaning as that defined above and X represents a substituent such as —OH, —OR$^2$, —OAc, —O—N=CR$^2$R$^3$, —Cl, —Br or —I wherein R$^2$ and R$^3$ are the same as R defined above and may be the same or different and Ac means an acetyl group.

Besides, an organopolysiloxane having hydroxyl groups at the ends, a hydrogen polysiloxane as a crosslinking agent and an optional silane type crosslinking agent defined above are hardened through condensation.

It is also effective to use addition type silicone rubber layers which are crosslinked through the addition reaction of ≡Si-H groups with —CH=CH— groups. The addition type silicone rubber layer is relatively independent of humidity during hardening, can further be crosslinked at a high speed and thus can easily provide a silicone rubber layer having uniform physical properties. The addition type silicone rubber layer herein used is obtained by reacting a polyvalent hydrogen organopolysiloxane with a polysiloxane compound having at least two —CH=CH— groups in the molecule and desirably a product obtained by hardening, through crosslinking, a composition comprising the following components:

(1) 100 parts by weight of an organopolysiloxane having, in the molecule, at least two alkenyl groups (more desirably vinyl groups) directly bonded to silicon atoms;

(2) 0.1 to 10,000 parts by weight of an organohydrogenpolysiloxane having at least two ≡Si-H bonds in the molecule; and (3) 0.00001 to 10 parts by weight of an addition catalyst.

The alkenyl groups of Component (1) may be present at the ends or in the middle of the molecular chain and preferred organic groups other than the alkenyl groups are substituted or unsubstituted alkyl and/or aryl groups. Component (1) may comprise a small quantity of hydroxyl groups. Component (2) not only reacts with Component (1) to give a silicone rubber layer but also serves to impart, to the resulting silicone rubber layer, adhesion to a light-sensitive layer. The hydrogen atom of Component (2) may be present at the ends or in the middle of the molecular chain and preferred organic groups other than the hydrogen atom are selected from those defined above in connection with Component (1). It is preferred that at least 60% of the sum of the organic groups of Components (1) and (2) be methyl groups for the improvement of the ink repellency. The molecular structures of Components (1) and (2) may be linear, cyclic or branched ones. Either of them preferably has a molecular weight of more than 1,000 from the viewpoint of physical properties of the resulting rubber and more preferably the molecular weight of Component (1) exceeds 1,000.

Examples of Component (1) are α, ω-divinylpolydimethylsiloxane and (methylvinylsiloxane) (dimethylsiloxane) copolymers having methyl groups at both ends and examples of Component (2) are polydimethylsiloxane having hydroxyl groups at both ends, α, ω-dimethyl polymethylhydrogensiloxane, (methylhydrogen-siloxane) (dimethylsiloxane) copolymers having methyl groups at both ends and cyclic polymethylhydrogensiloxane.

The addition catalysts as Component (3) may arbitrarily be selected from known ones, but in particular platinum compounds are preferred and examples thereof include elemental platinum, platinum chloride, chloroplatinic acid and olefin-coordinated platinum. The composition may comprise a crosslinking inhibitor such as a vinyl group-containing organopolysiloxane, e.g., tetracyclo(methylvinyl)siloxane, an alcohol having a carbon-carbon triple bond, acetone, methyl ethyl ketone, methanol, ethanol or propylene glycol monomethyl ether for controlling the hardening rate of the composition.

These compositions undergo addition reactions as soon as these three components are mixed to thus initiate hardening. In this respect, the hardening rate is rapidly increased as the reaction temperature increases. Therefore, the hardening of the composition is performed at a temperature range within which properties of a substrate and a light-sensitive layer are not affected and is maintained at a high temperature till it is completely hardened for extending the pot life till the composition is converted into a rubber and for reducing the time required for hardening taken place on the light-sensitive layer. This is also preferred for achieving stable adhesion to the light-sensitive layer.

In addition to these composition, the composition may arbitrarily comprise known agents for imparting adhesion such as alkenyltrialkoxysilane, a hydroxyl group-containing organopolysiloxane which is a composition of condensed silicone rubber layer and/or a hydrolyzable functional group-containing silane (or siloxane) as well as known fillers such as silica for enhancing the rubber strength.

The silicone rubber layer used in the invention serves as an ink repellent layer. Incidentally, if the layer is thin, it has low ink repellency and is easily damaged, while if it is thick, the developability of the resulting layer is impaired. Therefore, the thickness thereof preferably ranges from 0.5 to 5 μm.

In the dry PS plate herein explained, other silicone rubber layers may further be applied onto the foregoing silicone rubber layer and an adhesive layer may be formed between the light-sensitive layer and the silicone rubber layer for improving the adhesion therebetween and for preventing the poisoning of the catalyst present in the silicone rubber composition.

Moreover, a transparent polymer film may be laminated with the silicone rubber layer or a transparent polymer coating can be applied onto the rubber layer for protecting the surface thereof. Examples of such polymers are polyethylene, polypropylene, polyvinyl chloride, polyvinylidene chloride, polyvinyl alcohol, polyethylene terephthalate and cellophane. These films may be used after orientation. Further, the films may be matted for improving adhesion to a printing frame under vacuum during imagewise exposure to light.

The dry PS plate of the invention is exposed to light through an original transparency and then developed with a developer capable of dissolving or swelling a part or whole of the light-sensitive resin layer on the image area (unexposed area) or a developer capable of swelling the silicone rubber layer. In this case, both the light-sensitive resin layer and the silicone rubber layer on the image area or only the silicone rubber layer on the image area are removed depending on the intensity of the developer used.

In the present invention, there may be used any known developers for dry PS plate. For instance, preferred are aliphatic hydrocarbons (for instance, hexane, heptane, "Isopar E, H, G" (trade name of aliphatic hydrocarbons available from ESSO Chemical Company), gasoline and kerosine), aromatic hydrocarbons (for instance, toluene and xylene), or halogenated hydrocarbons (for instance, trichloroethylene), to which the following polar solvents are added or polar solvents per se:

alcohols (methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol);

ketones (acetone and methyl ethyl ketone);

esters (ethyl acetate, methyl lactate, ethyl lactate, butyl lactate, propylene glycol monomethyl ether acetate, carbitol acetate, dimethylphthalate and diethylphthalate);

other polar solvents (triethyl phosphate and tricresyl phosphate).

Other developers usable in the invention include the foregoing organic solvent type developers to which water is added; those obtained by solubilizing the foregoing organic solvent in water by means of, for instance, a surfactant; these developers to which an alkaline agent such as sodium carbonate, monoethanolamine, diethanolamine, triethanolamine, sodium silicate, potassium silicate, sodium hydroxide, potassium hydroxide or sodium borate; or optionally tap water or an alkaline water per se.

Moreover, the developer may comprise a dye such as Crystal Violet, Victoria Pure Blue or Astrazone Red for simultaneously performing development and coloring of image areas.

The development can be carried out in the usual manner, for instance, by rubbing the plate surface with a developing pad containing a developer defined above or by rubbing the plate surface with a developing brush after pouring a developer thereon. Thus, the silicone rubber layer and the light-sensitive layer on the image areas are removed to expose the surface of the substrate or primer layer which serves as an ink receiving part, or only the silicone rubber layer is removed to expose the light-sensitive layer which serves as an ink receiving part.

The photopolymerizable composition of the present invention has very high sensitivity since it comprises a compound obtained by reacting one mole of a polyamine represented by the foregoing general formula (I) with at least two moles of a compound having a group capable of reacting with the polyamine and a polymerizable ethylenically unsaturated group and a photopolymerization initiator.

The dry PS plate of the present invention has a layer structure comprising a substrate provided thereon with, in order, a light-sensitive resin layer and a silicone rubber layer and the light-sensitive layer comprises the photopolymerizable composition and therefore, it has high sensitivity.

EXAMPLES

The present invention will hereinafter be described in more detail with reference to the following Examples, but the present invention is not restricted to these Examples.

Preparation Examples

PREPARATION OF COMPOUND A (TABLE 1)

To 43.3 g (0.305 mole) of glycidyl methacrylate, there was dropwise added 20 g of Gaskamine 328 (available from Mitsubishi Gas Chemical Co., Inc.) at room temperature. After the dropwise addition, the reaction mixture was stirred at 80° C. for 5 hours to complete the reaction.

EXAMPLES 1 TO 5 AND COMPARATIVE EXAMPLES 1 AND 2

An aluminum plate having a thickness of 0.30 mm was surface-grained with a nylon brush and an aqueous suspension of 400 mesh pumice stone and then sufficiently washed with water. The aluminum plate was etched by immersing in a 10% solution of sodium hydroxide at 70° C. for 60 seconds, washed with running water, neutralized and washed with a 20% nitric acid solution and then washed with water. Then the plate was subjected to electrolytic surface graining treatment at a $V_A$ of 12.7V, a quantity of anode time electricity of 160 coulomb/$dm^2$ using a sinusoidal alternating waved current in a 1% aqueous solution of nitric acid. At this stage, the surface roughness thereof was determined to be 0.6 $\mu$ (in terms of Ra unit). Subsequently, the plate was desmutted by immersing in a 30% aqueous solution of sulfuric acid at 55° C. for 2 minutes and then anodized at a current density of 2 A/$dm^2$ for 2 minutes in a 20% aqueous solution of sulfuric acid so that the thickness of the resulting anodized layer was equal to 2.7 g/$m^2$.

A light-sensitive solution having the following composition was applied onto the aluminum plate thus treated in an amount of 2.0 g/$m^2$ and then dried at 100° C. for 5 minutes to form a light-sensitive layer.

| | |
|---|---|
| monomer shown in Table 2 | 2.0 g |
| allyl methacrylate/methacrylic acid copolymer (copolymerization molar ratio = 80/20) | 2.0 g |
| thioxanthone | 0.3 g |
| fluorine atom-containing surfactant (Defenser MCF323) | 0.05 g |
| methyl ethyl ketone | 20 g |
| propylene glycol monomethyl ether acetate | 20 g |

A 3% by weight aqueous solution of a polyvinyl alcohol (degree of saponification=86.5 to 89 mole%; degree of polymerization=1,000) was applied onto the light-sensitive layer in an amount of 2 g/$m^2$ (weighed after drying) and then dried at 100 ° C. for 5 minutes.

A positive film carrying half tone dots at a density of 200 lines/inch and a gray scale (G/S) having an optical density difference of 0.15 were, in order, put on the resulting presensitized plate and the resulting assembly was exposed to light for 30 counts using a vacuum printing press: FT 261 V UDNS ULTRA-PLUS FLIPTOP PLATE MAKER available from Nu Arc Company.

Then the exposed plate was developed by immersing it in a developer having the following composition at 25° C. for one minute.

| | |
|---|---|
| 1K potassium silicate | 30 g |
| potassium hydroxide | 15 g |
| compound of the following formula: | 3 g |

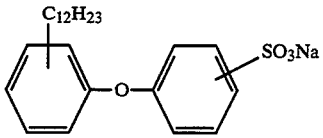

| | |
|---|---|
| | 3 g |
| water | 1000 g |

The gray scale sensitivity of the developed plate was evaluated. In this respect, the term "gray scale sensitivity" means the number of steps of the gray scale at which the light-sensitive layer was not removed after the development. The greater the value, the higher the sensitivity of the plate. The results thus obtained are listed in Table 2 which indicate that a highly sensitive photopolymerizable composition can be obtained by the use of the photopolymerizable compound of the present invention.

TABLE 2

| Ex. No. | Compound Used | Sensitivity No. of Steps |
|---|---|---|
| 1 | Compound A listed in Table 1 | 8.0 |
| 2 | Compound B listed in Table 1 | 8.5 |
| 3 | Compound C listed in Table 1 | 9.0 |
| 4 | Compound D listed in Table 1 | 9.5 |
| 5 | Compound E listed in Table 1 | 8.5 |
| Comp. Ex. No. | | |
| 1 | trimethylolpropane triacrylate | 7 |
| 2 | 1:4 (molar ratio) adduct of m-xylylene-diamine with glycidyl methacrylate | 6 |

EXAMPLE 6

An aluminum plate of JIS A 1050 having a thickness of 0.3 mm which had been degreased in the usual manner was immersed in a 1% aqueous solution of KBM603 (available from Shin-Etsu Chemical Co., Ltd.) which was an aminosilane coupling agent and then dried at room temperature. The following primer solution was applied onto the aluminum plate in an amount of 4 g/m$^2$ (weighed after drying) and then heated at 140° C. for 2 minutes to dry and harden the layer.

| Component | Amount (part by weight) |
|---|---|
| Sanprene IB1700D (terminal hydroxyl group-containing thermoplastic urethane resin, 30% solution in methyl ethyl ketone; available from | 10 |

-continued

| Component | Amount (part by weight) |
|---|---|
| Sanyo Chemical Industries, Ltd.) | |
| Takenate D110N (polyfunctional isocyanate compound, 75% solution in ethyl acetate; available from Takeda Chemical Industries, Ltd.) | 0.5 |
| TiO$_2$ | 0.1 |
| Defenser MCF 323 (fluorine atom-containing surfactant, 30% solution in methyl isobutyl ketone; available from Dainippon Ink and Chemicals, Inc.) | 0.03 |
| propylene glycol methyl ether acetate | 50 |
| methyl lactate | 20 |

The following photopolymerizable light-sensitive solution was applied onto the aluminum plate on which the primer layer had been applied in an amount of 5 g/m$^2$ (weighed after drying) and then heated at 100° C. for one minute.

| Component | Amount (part by weight) |
|---|---|
| Krisbon 3006LV (available from Dainippon Ink and Chemicals, Inc.) | 1.5 |
| Compound A listed in Table 1 | 1.0 |
| CH$_2$=CHCOO—(CH$_2$CH$_2$O)$_{14}$—COCH=CH$_2$ (A-600; available from Shin Nakamura Chemical Co., Ltd.) | 1.0 |
| ethyl Michler's ketone | 0.15 |
| 2,4-diethylthioxanthone | 0.15 |
| naphthalenesulfonate of Victoria Pure Blue BOH | 0.01 |
| Defenser MCF 323 (fluorine atom-containing surfactant, 30% solution in methyl isobutyl ketone; available from Dainippon Ink and Chemicals, Inc.) | 0.03 |
| methyl ethyl ketone | 10 |
| propylene glycol methyl ether | 20 |

Then the following solution of a composition for silicone rubber layer was applied onto the foregoing photopolymerizable light-sensitive layer in an amount of 2.0 g/m$^2$ (weighed after drying) and dried at 140° C. for 2 minutes to give hardened silicone rubber layer.

| Component | Amount (part by weight) |
|---|---|
| α, ω-divinylpolydimethylsiloxane (degree of polymerization = about 700) | 9 |
| (CH$_3$)$_3$Si—O—(Si(CH$_3$)$_2$—O)$_{30}$—(SiH(CH$_3$)—O)$_{10}$—Si(CH$_3$)$_3$ | 1.2 |
| polydimethylsiloxane (degree of polymerization = about 8,000) | 0.5 |
| olefin-chloroplatinic acid | 0.2 |
| inhibitor | 0.3 |
| Isopar G (available from ESSO Chemical Company | 140 |

A one-side matted biaxially oriented polypropylene film having a thickness of 12 μm was laminated with the resulting silicone rubber layer in such a manner that the non-matted face of the film came in contact with the silicone rubber layer to give a dry PS plate.

EXAMPLES 7 TO 10

The same procedures used in Example 6 were repeated except that compounds B, C, D and E listed in Table 1 each was substituted for the compound A in the light-sensitive layer of Example 6.

EXAMPLE 11

The following solution for silicone rubber layer was applied onto the light-sensitive layer obtained in Example 6 in an amount of 2.0 g/m$^2$ (weighed after drying)

and then dried at 120° C. for 2 minutes to give a silicone rubber layer.

| Component | Amount (part by weight) |
|---|---|
| α,ω-dihydroxypolydimethylsiloxane (degree of polymerization = about 700) | 9 |
| $CH_3—Si(O—CO—CH_3)_3$ | 0.3 |
| tin catalyst | 0.1 |
| Isopar G (petroleum type solvent; available from ESSO Chemical Company) | 140 |

In the same manner used in Example 6, a one-side matted biaxially oriented polypropylene film having a thickness of 12 μm was laminated with the resulting silicone rubber layer to give a dry PS plate.

COMPARATIVE EXAMPLES 3 AND 4

An adduct of m-xylylenediamine and glycidyl methacrylate (molar ratio=1:4) was substituted for the compound A in the light-sensitive layer of Example 6. The same silicone rubber layers used in Examples 6 and 11 each was applied onto the foregoing light-sensitive layer to give a silicone rubber layer.

The same one-side matted biaxially oriented polypropylene film was laminated with each silicone rubber layer thus obtained to give dry PS plates of Comparative Examples 3 and 4.

A positive film having half tone dots at a density of 200 lines/inch and a gray scale (G/S) having an optical density difference of 0.15 were, in this order, put on each of the resulting dry PS plate to expose, to light, the dry PS plate for 30 counts using a vacuum exposure machine: FT261V UDNS ULTRA-PLUS FLIPTOP PLATE MAKER (available from Nu Arc Company), the laminate film was peeled off, the exposed plate was immersed in a tripropylene glycol solution maintained at 40° C. for one minute and the silicone rubber layer on the non-exposed areas was removed by rubbing the plate surface with a developing pad in water to give each corresponding dry lithographic printing plate. Then the gray scale sensitivity was evaluated. In this respect, the term "gray scale sensitivity" herein means the number of step of the gray scale at which the silicone rubber layer was not removed after the development and the greater the number of step of the gray scale, the higher the sensitivity of the dry PS plate. The results thus obtained are listed in Table 3 which clearly indicate that a dry PS plate having high sensitivity can be obtained by the use of the monomer of the present invention.

| Example No. | Compound Used | Sensitivity (number of step) |
|---|---|---|
| 6 | A | 8.5 |
| 7 | B | 9 |
| 8 | C | 9.5 |
| 9 | D | 9 |
| 10 | E | 10 |
| 11 | A | 8.5 |
| Comp. Ex. No. | | |
| 3 | *) | 7 |
| 4 | *) | 7 |

*) 1:4 (molar ratio) adduct of m-xylylenediamine and glycidyl methacrylate.

What is claimed is:

1. A photopolymerizable composition comprising:
   (a) the reaction product of 6 moles of glycidyl methacrylate with 1 mole of polyamine of the following formula:

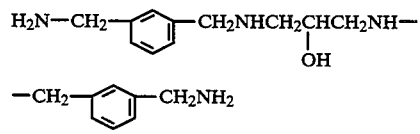

and (b) a photopolymerization initiator.

2. A photopolymerizable composition comprising:
   (a) the reaction product of 8 moles of glycidyl methacrylate with 1 mole of polyamine of the following formula:

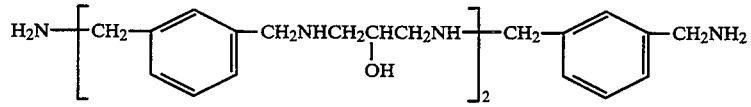

and (b) a photopolymerization initiator.

3. A photopolymerizable composition comprising:
   (a) the reaction product of 10 moles of glycidyl methacrylate with 1 mole of polyamine of the following formula:

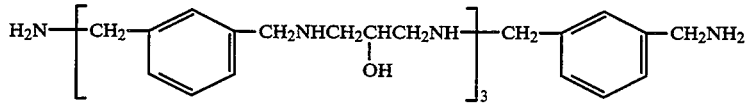

and (b) a photopolymerization initiator.

* * * * *